(12) United States Patent
Mizuguchi et al.

(10) Patent No.: US 8,941,163 B2
(45) Date of Patent: Jan. 27, 2015

(54) DRAM DEVICE

(71) Applicant: Renesas Electronics Corporation, Kawasaki (JP)

(72) Inventors: Ichirou Mizuguchi, Kanagawa (JP); Hiroshi Furuta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/916,240

(22) Filed: Jun. 12, 2013

(65) Prior Publication Data

US 2013/0334582 A1 Dec. 19, 2013

(30) Foreign Application Priority Data

Jun. 13, 2012 (JP) ................................ 2012-133900

(51) Int. Cl.
*H01L 27/108* (2006.01)

(52) U.S. Cl.
CPC .... *H01L 27/10805* (2013.01); *H01L 27/10811* (2013.01); *H01L 27/10847* (2013.01); *H01L 27/10882* (2013.01)
USPC .......................................... 257/296; 257/306

(58) Field of Classification Search
None
See application file for complete search history.

(56) References Cited

U.S. PATENT DOCUMENTS

| 4,597,059 | A | * | 6/1986 | Takemae et al. ............... 365/149 |
| 4,691,304 | A | * | 9/1987 | Hori et al. ...................... 365/226 |
| 4,890,145 | A | * | 12/1989 | Malhi ............................ 257/302 |
| 5,321,647 | A | * | 6/1994 | Bronner et al. ............... 365/149 |
| 5,604,707 | A | * | 2/1997 | Kuge et al. ..................... 365/226 |
| RE37,184 | E | * | 5/2001 | Kushiyama et al. .......... 365/201 |
| 6,462,610 | B1 | * | 10/2002 | Manning ........................ 327/534 |
| 6,730,947 | B2 | | 5/2004 | Kuwazawa |
| 7,170,798 | B2 | * | 1/2007 | Poechmueller .......... 365/189.09 |

FOREIGN PATENT DOCUMENTS

| JP | 6-20469 A | 1/1994 |
| JP | 2003-100904 A | 4/2003 |

OTHER PUBLICATIONS

Baumann, R., "Soft Errors in Advanced Computer Systems", IEEE Design and Test of Computers, pp. 258-266, May-Jun. 2005.*
Sridharan, V.; Liberty, D., "A study of DRAM failures in the field," High Performance Computing, Networking, Storage and Analysis (SC), 2012 International Conference for , vol., no., pp. 1,11, Nov. 10-16, 2012.*
Johnston, A. "Scaling and Technology Issues for Soft Error Rates", 4th Annual Research Conference on Reliability, Stanford University, pp. 1-9, Oct. 2000.*
Tezzaron Semiconductor, "Soft Erros in Electronic Memory—A White Paper", Version 1.1., pp-1-7, Jan. 5, 2004.*

* cited by examiner

*Primary Examiner* — Joseph Schoenholtz
(74) *Attorney, Agent, or Firm* — Foley & Lardner LLP

(57) ABSTRACT

A DRAM device includes plural N-channel MIS transistors arranged in a matrix over a P well, and a plurality of capacitors formed corresponding to the plurality of N-channel MIS transistors, and plural word lines formed corresponding to each row of the plurality of N-channel MIS transistors, and a plurality of bit lines formed corresponding to each column of the plurality of N-channel MIS transistors, and a P⁺ diffusion layer formed extending in the direction that the plurality of word lines extend and supplied with a p well voltage potential.

14 Claims, 14 Drawing Sheets

DRAM DEVICE

CROSS-REFERENCE TO RELATED APPLICATIONS

The disclosure of Japanese Patent Application No. 2012-133900 filed on Jun. 13, 2012 including the specification, drawings and abstract is incorporated herein by reference in its entirety.

BACKGROUND

The present invention relates to DRAM device ideal for preventing soft errors.

So-called soft errors (information inversions) in memories such as DRAM (Dynamic Random Access Memory) and SRAM (Static Random Access Memories) are broadly grouped into a mode occurring due to fluctuations in voltage potential from carriers generated during ray (ion) bombardment that collect in the node diffusion layer; and a mode occurring when a parasitic bipolar element formed over the two diffusion layers and substrate of a transistor configuring a memory cell operates (turns on) causing fluctuations in the voltage potential of the node diffusion layer. So in recent years, greater immunity to soft errors is needed that makes (parasitic) operation of a parasitic bipolar element formed over the two diffusion layers and substrate of a transistor less likely to occur.

The DRAM will however have a small SER (Soft Error Rate) per bit unit compared to the SRAM provided that the two devices have the same cell voltage and design standards. One reason for this small SER is that the DRAM has a smaller surface area on the memory node side diffusion layer (node diffusion layer) compared to the SRAM and so the electrical charge accumulated during ray (ion) bombardment is small. Another reason is the large electrical charge quantity accumulated in nodes having a capacitor (capacitance element). This small SER has up to now been the reason for the lack of intense efforts to find countermeasures to soft errors.

However, the DRAM has a small memory cell size compared to the SRAM and therefore possesses a large memory capacity per single chip. So in a DRAM the soft error rate (SER) per single chip is more of a problem than the SER per bit unit. The high degree of integration in semiconductor circuits as well as ever larger capacity devices have served to aggravate this problem still further.

Suppressing the operation of the above stated parasitic bipolar element requires lowering the resistance value of the substrate or wells (hereafter collectively called, well) forming the transistor configuring the memory cell, that is known for example as a latch-up countermeasure.

Japanese Unexamined Patent Application Publication No. Hei6(1994)-20469 and Japanese Unexamined Patent Application Publication No. 2003-100904 disclose related technology.

Japanese Unexamined Patent Application Publication No. Hei6(1994)-20469 discloses a memory device to temporarily apply a specified voltage potential to the array well in order to reduce the well noise.

Japanese Unexamined Patent Application Publication No. 2003-100904 discloses a semiconductor integrated circuit device containing a SRAM forming the embedded impurity layer for a countermeasure to alpha ($\alpha$) ray soft errors.

SUMMARY

The Japanese Unexamined Patent Application Publication No. Hei6(1994)-20469 however gives no disclosure whatsoever of how the contact is actually formed over array well supplying the specified voltage potential. The technology of the related art is therefore unable to suppress operation of the parasitic bipolar element and so has the problem of being unable to effectively prevent soft errors.

Other issues as well as novel feature will be clearly described from the description in these specifications and the accompanying drawings.

According to an aspect of the present invention, a DRAM device is comprised of a first conducting type first well voltage diffusion layer formed extending in the direction that the word lines extend, and supplied with a first conducting type well voltage potential.

According to the aspect of the present invention, a DRAM device capable of effectively preventing soft errors can be provided.

DETAILED DESCRIPTION

<Prior Study by the Present Inventors>

The study made by the present inventors is first of all described prior to the description of the embodiments.

Figure 10:
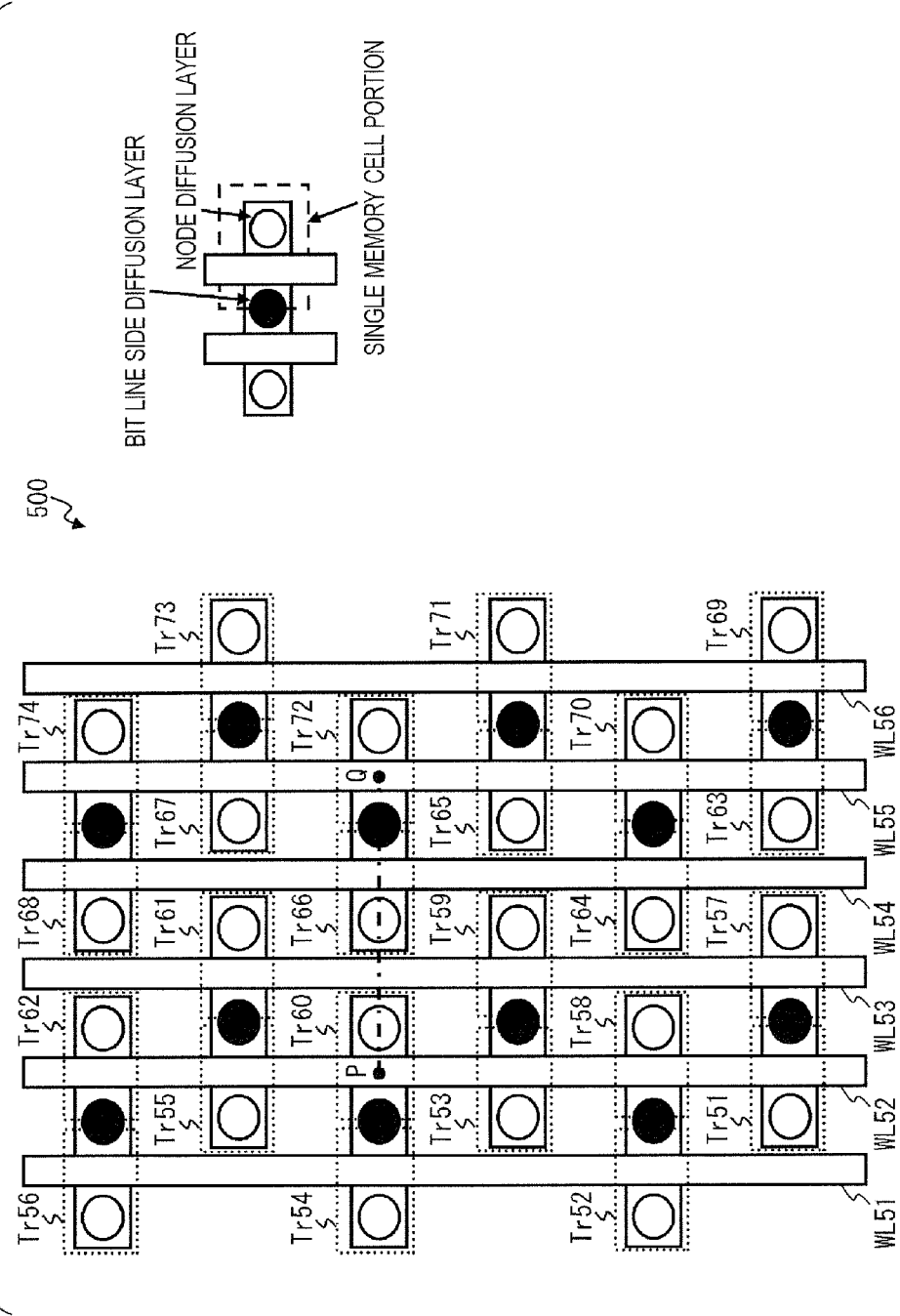
FIG. 10 is a drawing showing a structure of the DRAM device concept prior to achieving the embodiments.

FIG. 10 is a drawing showing the structure of the DRAM device 500 concept prior to achieving the embodiments. In the DRAM device shown in FIG. 10, a plurality of N-channel MIS transistors (hereafter simply called transistors) TR51-TR74 are arranged in a matrix shape within each of a plurality of memory cells MC51-MC74. A plurality of word lines WL51-WL56 moreover are wired corresponding to each row (vertical direction along paper surface) of the plurality of memory cells MC51-MC74.

Though not shown in FIG. 10, there are also in fact plural capacitors C51-C74 contained in each of the plurality of memory cells MC51-MC74, and plural bit lines BL51-BL56 formed to correspond to the each column (lateral direction along the paper surface) of the plurality of memory cells MC51-MC74. Other components not shown in the drawing in FIG. are selection circuits for selecting memory cells for reading or writing of data by any of the bit lines and word lines, and amplifier circuits for amplifying the voltage potential on the bit lines selected during data reading, and outputting the read-out data.

The word line WL51 is a gate electrode for each of the transistors Tr52, Tr54, and Tr56. The word line WL52 is in the same way, a gate electrode for each of the transistors Tr51, Tr58, Tr53, Tr60, Tr55, and Tr62. The word line WL53 is a gate electrode for each of the transistors Tr57, Tr59, and Tr61. The word line WL54 is a gate electrode for each of the transistors Tr64, Tr66, and Tr68. The word line WL55 is a gate electrode for each of the transistors Tr63, Tr70, Tr65, Tr72, Tr67, and Tr69, Tr67, and Tr74. The word line WL56 is a gate electrode for the transistors Tr69, Tr71, and Tr73.

Though not shown in the drawing the bit line BL51 is coupled to one end of the respective source and drain (named both N+ diffusion layer; bit line side diffusion layer) of the transistors Tr51, Tr57, Tr63, and Tr69. The bit line BL52 is coupled to one end of the respective source and drain of the transistors Tr52, Tr58, Tr64, and Tr70. The bit line BL53 is coupled to one end of the respective sources and drain of the transistors Tr53, Tr59, Tr65, and Tr71. The bit line BL54 is coupled to one end of the respective source and drain of the transistors Tr54, Tr60, Tr66, and Tr72. The bit line BL55 is coupled to one end of the respective source and drain of the transistors Tr55, Tr61, Tr67 and Tr73. The bit line BL56 is coupled to one end of the respective source and drain of the transistors Tr56, Tr62, Tr68, and Tr74. In the example in FIG. 10, the respective bit line side diffusion layers of the transistors Tr51-Tr74 are equivalent to the black dot locations.

Also, though not shown in the drawing, the other end of the respective source and drain (named both N+ diffusion layer; node diffusion layer) of the transistors Tr51-Tr74 is coupled to one electrode (lower electrode) of the respective capacitors C51-C74. The other electrode of the capacitors C51-C74 is utilized for example by the common cell plate electrode Cp50. This cell plate electrode Cp50 is mounted so as to cover the transistors Tr51-Tr74. In the example in FIG. 10, the respective node diffusion layers of the transistors Tr51-Tr74 are equivalent to the white dot locations.

Figure 11:
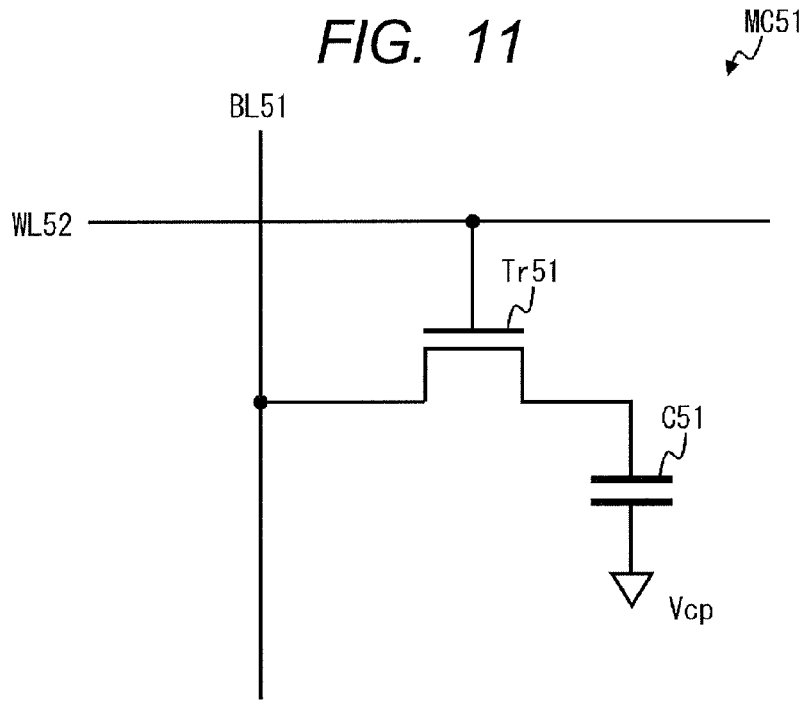
FIG. 11 is a circuit diagram showing the structure of the memory cell.

FIG. 11 is a circuit diagram showing an example of structure of the memory cell MC51. The other memory cells MC52-MC74 have the same structure as the memory cell MC51 so their description is omitted. The memory cell MC51 shown in FIG. 11 includes a transistor Tr51 and a capacitor C51. A bit line BL51 is coupled to one end of the source and drain (bit line side diffusion layer) in the transistor Tr51, and the other end of the source or drain (node diffusion layer) is coupled to one end of the capacitor C51, and the gate electrode is one section. (or portion) of the word line WL52. Approximately half the voltage of the power supply voltage Vcc is for example supplied as the cell plate voltage Vcp to the other electrode (namely, cell plate electrode Cp50) of the capacitor C51.

To read out the data stored in the memory cell MC51, the voltage potential of word line WL52 for example is set to H level (power supply voltage Vcc level). The transistor Tr51 is turned on in this way so that the data stored in the capacitor C51 is conveyed to the bit line BL51. The amplifier circuit installed in the latter stage outputs the read out data according to the voltage potential on the bit line BL51. On the other hand, when writing data onto the memory cell MC51, the voltage potential of the bit line BL51 is charged to a voltage potential according to the write data and the voltage potential on word line WL52 set to H level. The transistor Tr51 is in this way turned on, and data is written into the capacitor C51 from the bit line BL51.

Figure 12:
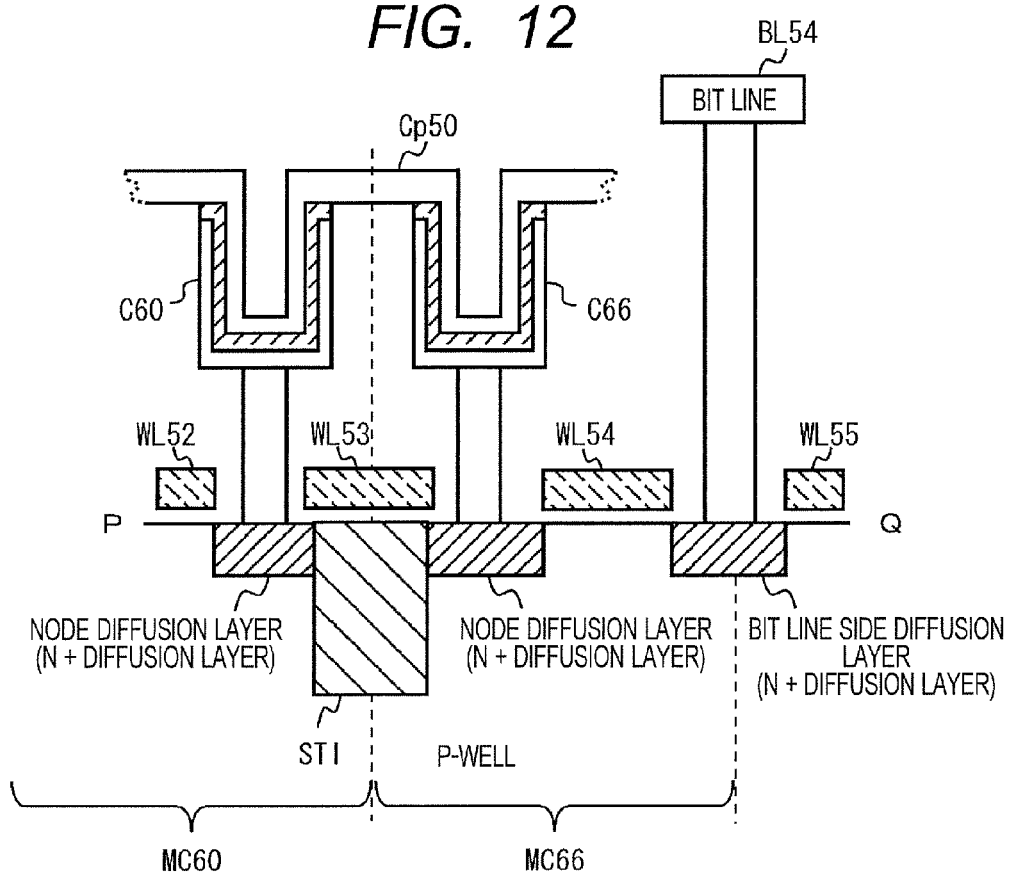
FIG. 12 is a cross sectional view showing a structure of the DRAM device concept prior to achieving the embodiments.

FIG. 12 is a cross sectional view showing the structure along the lines P-Q in FIG. 10. Compared to the flat drawing in FIG. 10, the dimension of the gate electrodes (word line) WL52-WL55 and the node diffusion layer in right and left direction along paper surface are expressed in a relatively large size. The dimensional relation between the gate electrode and the node diffusion layer is described with a pattern shape. The gate electrode dimensions are expressed as longer than actual dimensions. Moreover, the dimensions above and below the paper surface do not show the actual dimensions. The same status holds true for the cross sectional views from here onward.

In the memory cell MC66 as shown in FIG. 12, two N+ diffusion layers (node diffusion layer and bit line side diffusion layer) are formed over the P well. A gate electrode and a gate insulator film (not shown in drawing) are further formed in sequence over the P well surface between these two N+ diffusion layers. This gate electrode is one portion (or section) of the word line WL54. A bit line BL54 is coupled by way of a contact plug to the bit line side diffusion layer. The one electrode (lower electrode) of the capacitor C66 is coupled by way of a contact plug to the node diffusion layer. Further, a common cell plate electrode Cp50 is formed as the other electrode of the capacitors C51-C74. The example shown in FIG. 12 employs a cylinder type capacitor structure.

Two N+ diffusion layers are formed in the same way over the P well in the memory cell MC60 adjoining the memory cell MC66. Among the two N+ diffusion layers, the example shown in FIG. 12, only shows the node diffusion layer in proximity to the memory cell MC66. A gate insulator film (not shown in drawing) and a gate electrode are further formed over the P well surface of these two N+ diffusion layers. This gate electrode is one portion (or section) of the word line WL52. One electrode (lower electrode) of the capacitor C60 is coupled to the node diffusion layer by way of the contact plug. The respective node diffusion layers of the memory cells MC66 and MC60 are separated by the STI. A word line WL53 is positioned above the STI on the cross section between P-Q.

Figure 13:
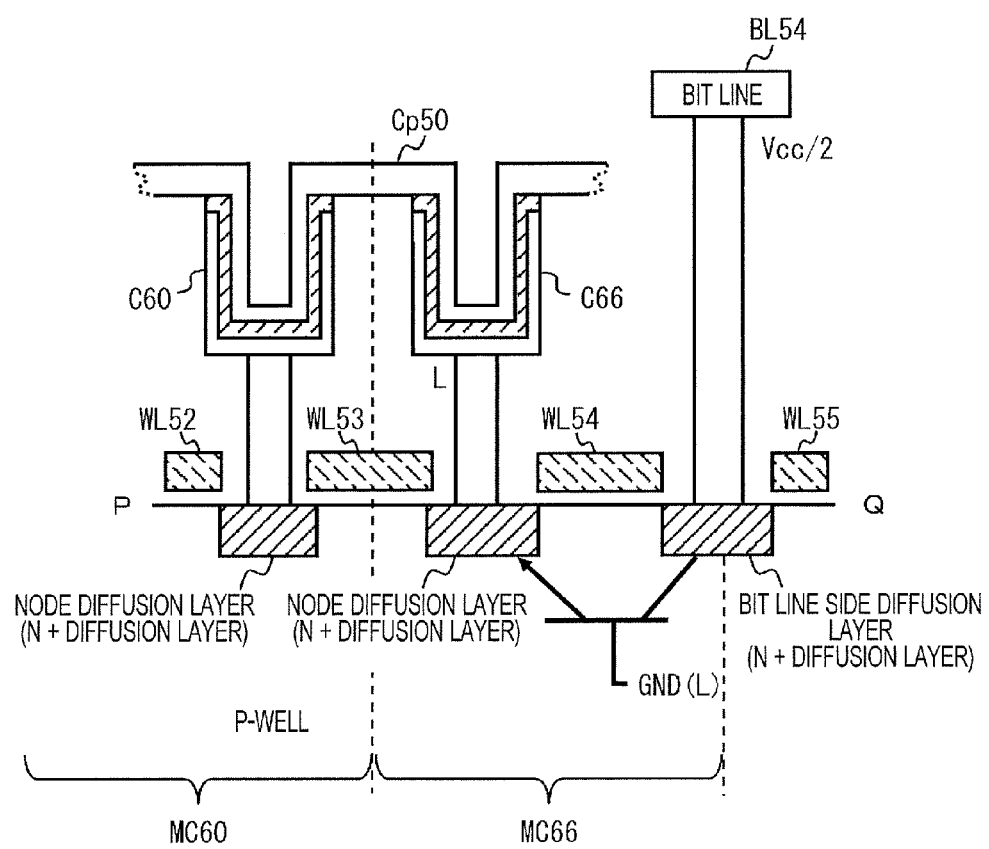
FIG. 13 is a cross sectional view for describing issues with of DRAM device concept prior to achieving the embodiments.
Figure 14:
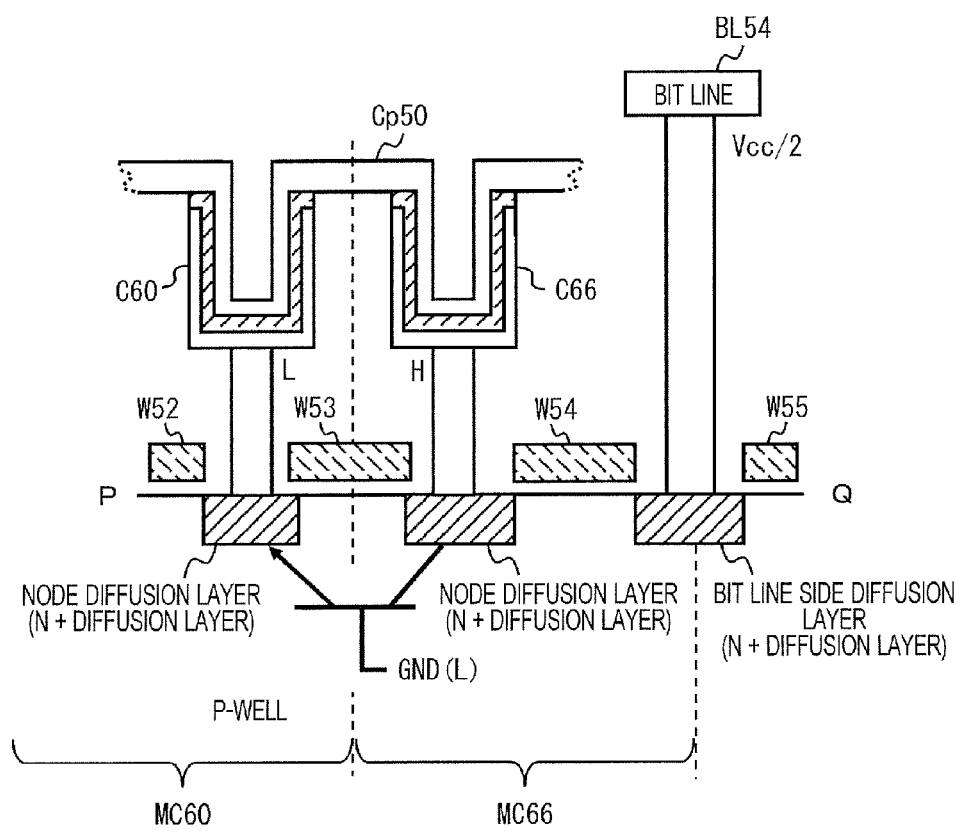
FIG. 14 is a cross sectional view for describing issues with the DRAM device concept prior to achieving the embodiments.

The parasitic bipolar element formed over the DRAM device 500 is described next while referring to the cross sectional views in FIG. 13 and FIG. 14. The structure of the cross sectional view in FIG. 13 and FIG. 14 is the same as in FIG. so that description is omitted. The STI is not shown in order to make the description of FIG. 13 and FIG. 14 easier to describe.

In this example, a method (Vcc/2 precharge method) is employed to precharge the bit line to about half the voltage (Vcc/2) of the power supply voltage Vcc. This example also shows that the cell plate voltage Vcp is approximately half (Vcc/2) the power supply voltage Vcc. In this embodiment the P well voltage potential is shown as the ground voltage GND level.

Referring first of all to FIG. 13, a parasitic bipolar element is formed with the P well as the base, the node diffusion layer as the emitter, and the bit line side diffusion layer as the collector for the case where the bit line BL54 is pre-charged to voltage Vcc/2, and the one electrode (lower electrode) of the capacitor C66 is the L level (ground voltage GND level). This parasitic bipolar element tend to easily turn on since the voltage across CE is Vcc/2 and the voltage across BE is 0 volts. For this reason, soft errors may possibly occur.

A parasitic bipolar element is formed with the P well as the base, the bit line side diffusion layer as the emitter, and the node diffusion layer as the collector when one electrode (lower electrode) of the capacitor C66 is at H level (power supply voltage Vcc level). However the base voltage is lower than the emitter voltage by Vcc/2 and so does not easily turn on. There is therefore a low probability that soft errors will occur.

Referring next to FIG. 14, a parasitic bipolar element is formed with the P well as the base, the node diffusion layer on the memory cell MC60 side as the emitter, and the node diffusion layer on the memory cell M66 side as the collector, when the one electrode (lower electrode) on the capacitor C66 of memory cell MC66 shows an H level, and one electrode (lower electrode) of the capacitor C60 of the adjacent memory cell MC60 shows an L level. This parasitic bipolar element turns on easily since the voltage across CE is Vcc, and the voltage across BE is 0 volts. For this reason, soft errors may possibly occur.

A parasitic bipolar element is also formed with the P well as the base, the node diffusion layer on the memory cell MC66 side as the emitter, and the node diffusion layer on the memory cell MC60 side as the collector, even when the one electrode (lower electrode) on the capacitor C66 of memory cell MC66 shows an L level, and one electrode (lower electrode) of the capacitor C60 of the adjacent memory cell MC60 shows an L level. This parasitic bipolar element also turns on easily since the voltage across CE is Vcc, and the voltage across BE is 0 volts. Therefore, soft errors might possibly occur.

Lowering the resistance value of the P-well is effective in preventing soft errors from occurring by suppressing operation of this parasitic bipolar element. One method to lower the P well resistance value is for example to boost the impurity level (called doping) in the P well. However, boosting the impurities in the P well might possibly greatly increase the leakage current of the $N^+$ diffusion layer (node diffusion layer and bit line side diffusion layer). So another possible method considered for lowering the P well resistance value is to form the $P^+$ diffusion layer (hereafter, called the well voltage diffusion layer) supplied with the P well voltage potential, over the P well.

Figure 15:
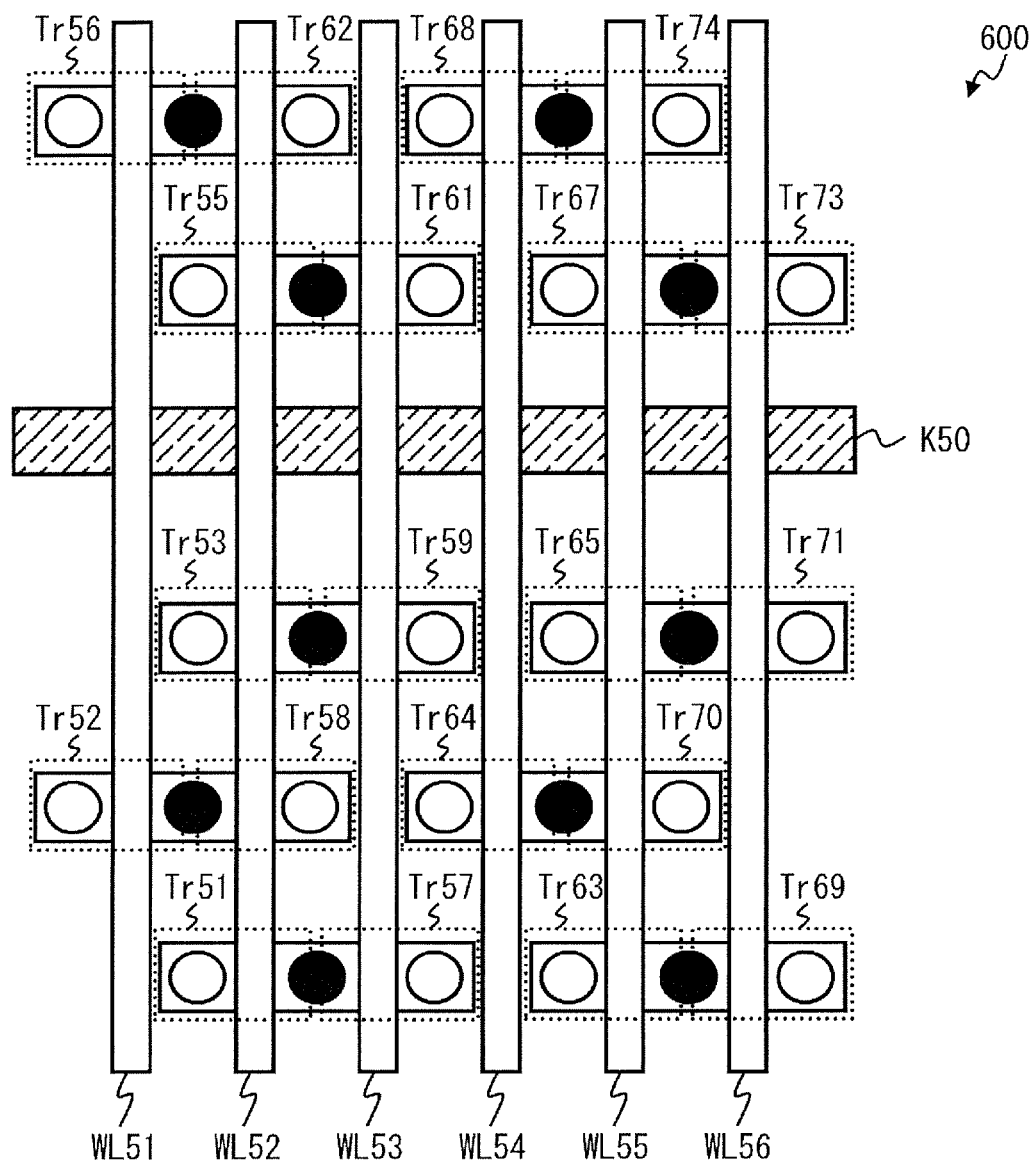
FIG. 15 is a drawing showing the structure of the DRAM device concept prior to achieving the embodiments.

FIG. 15 is a drawing showing the structure of the DRAM device 600 for the prior concept leading to the present embodiment. Compared to the Dram device 500 shown in FIG. 10, the DRAM device 600 in the example in FIG. 15 further include a well voltage diffusion layer K50. This well voltage diffusion layer K50 is a $P^+$ diffusion layer supplied with a P well voltage potential, and is formed extending in a direction perpendicular to the wiring direction (extension direction) of the word lines WL51-WL56. Forming the well voltage diffusion layer K50 serves to lower the resistance value of the P well, and suppress operation of the parasitic bipolar element.

However, the example in FIG. 15 has the problem that due to partition the well voltage diffusion layers K50 by plural word lines WL51-WL56, the P well voltage potential must be supplied to the respective plural well voltage diffusion layers K50 that were partitioned. On the other hand, avoiding the problem of partitioning the well voltage diffusion layer K50 by first forming the well voltage diffusion layer K50 as $N^+$ diffusion layers and word lines has the problem of increasing the number of (manufacturing) processes. Still another factor is that the word lines pass over the $N^+$ diffusion layers (node diffusion layer and bit line side diffusion layers) and $P^+$ diffusion layer (well voltage diffusion layer) so that leakage current from the $N^+$ diffusion layer to the $P^+$ diffusion layer might occur.

The embodiments are hereafter described while referring to the drawings. The drawings are abbreviated and so the drawing description must not be utilized as a basis for narrowly interpreting the technical range of the embodiments. Moreover, the same reference numerals are attached to the same elements and redundant descriptions are omitted.

When necessary for the purpose of convenience in the following embodiments, the description is divided to cover a plurality of sections or states of the embodiments, however unless specified otherwise, these descriptions are not unrelated to each other, and one part is a portion of another part, also all of the variations, application examples, detailed descriptions and supplementary descriptions and so on are mutually related. Moreover when describing the numbers of elements (including the number of pieces, numerical values, numerical quantity, and range, etc.) in the following embodiments, except in cases where clearly specified and fundamentally and obviously restricted to a specified number or quantity, the present invention shall not be limited to a specific quantity and may be greater or smaller than a specific quantity.

Also in the following embodiments, except in cases where clearly specified and fundamentally and obviously necessary, the structural elements (including the operation steps, etc.) are not always essential. Similarly, in the following embodiments, when describing the shape and the positional relationship and so on of the structural elements, except in cases where clearly specified and fundamentally and obviously not the case, structural elements that are essentially similar or approaching that shape and so on are included. The same is also true for the above numerical quantities (including the number of pieces, numerical values, numerical quantity, and range, etc.).

First Embodiment

Figure 1:
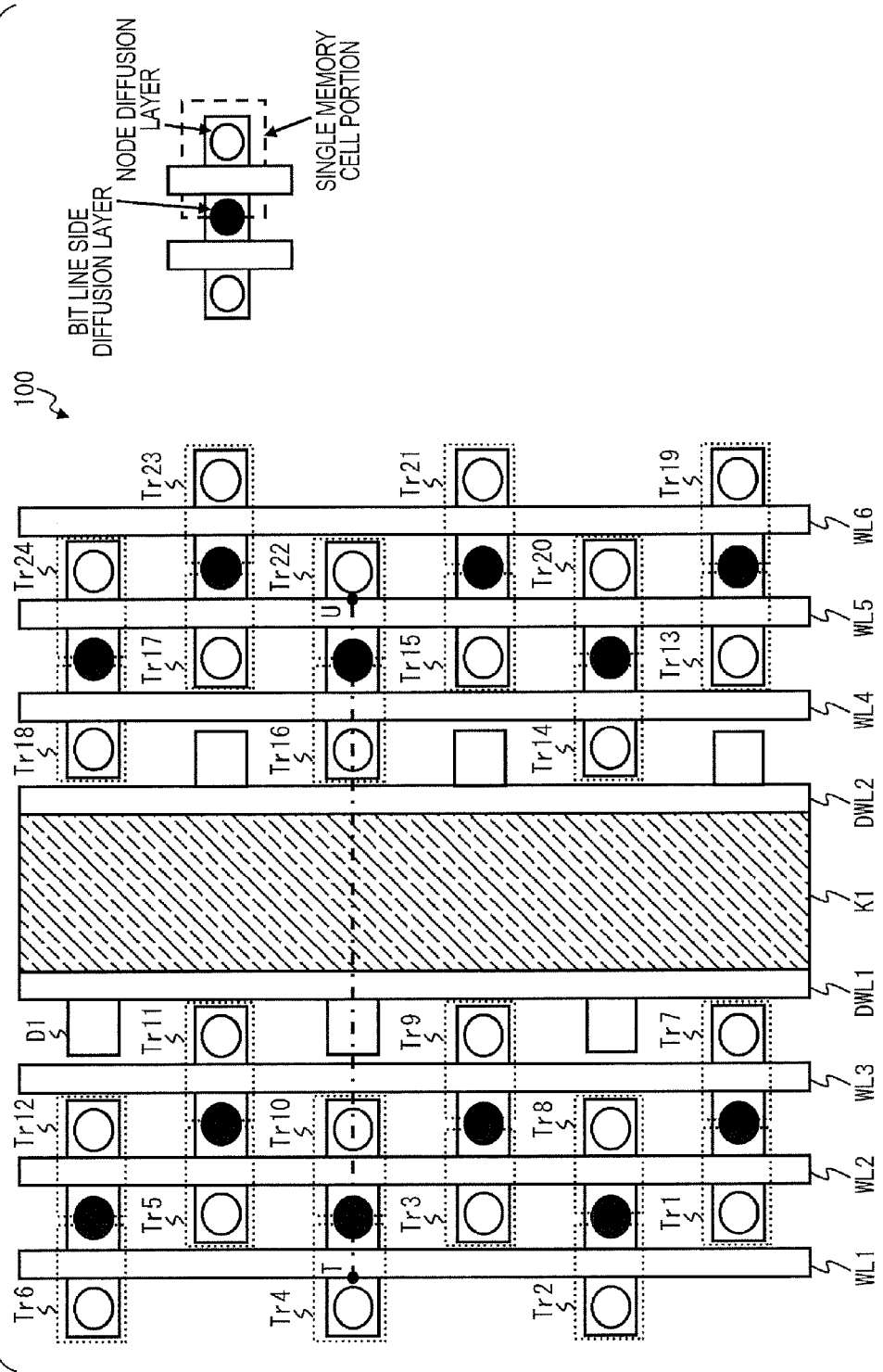
FIG. 1 is a drawing showing an example of the structure of the DRAM device of the first embodiment.

FIG. 1 is a drawing showing an example of the structure of the DRAM device 100 of the first embodiment. The DRAM device 100 of the present embodiment includes a first conduction type diffusion layer (well voltage diffusion layer) supplied with a first conduction type well voltage potential, and extending in the direction that the word lines extend. The DRAM device 100 of the first embodiment can in this way, prevent operation of the parasitic bipolar element and effectively suppress soft errors. A specific description is given next.

In the DRAM device 100 shown in FIG. 1, a plurality of N-channel MIS transistors (hereafter simply called transistors) Tr1-Tr24 contained within the respective plural memory cells MC1-MC24 are arrayed in a matrix shape. Also, a well voltage diffusion layer K1, plural word lines WL1-WL6, and dummy word lines DWL1, DWL2 are formed corresponding to each row (vertical direction along the paper surface) of the plural memory cells MC1-MC24. Though not shown in FIG. 1, each of the plural memory cells MC1-MC24 further actually includes a plurality of capacitors C1-C24, and a plurality of bit lines BL1-BL6 formed corresponding to each column (horizontal direction along the paper surface) of the plural memory cells MC1-MC24. Though also not shown in FIG. 1, also included are a selection circuit for selecting memory cells for reading or writing of data by selecting any of the bit lines and word lines, and amplifier circuit for amplifying the voltage potential on the bit lines selected during data read out, and outputting it as the read-out data, etc.

The dummy word lines (first and second dummy word lines) DWL1, DWL2 are wired between adjacent word lines (first and second word lines) WL3, WL4 among the plural word lines WL1-WL6. In the example in FIG. 1, the plural word lines WL1-WL6 and the dummy word lines DWL1, DWL2 are wired at equidistant intervals except between the dummy word lines DWL1, DWL2. The gap between the dummy word lines DWL1 and DWL2 is the same extent as the gap between the word lines WL1 and WL3. A P well (first conduction type well) voltage potential (ground voltage GND level voltage potential) is supplied to the dummy word lines DWL1 and DWL2.

Further, the well voltage diffusion layer K1 is formed between the dummy word lines DWL1 and DWL2. This well voltage diffusion layer k1 is a P$^+$ diffusion layer to which a P well voltage potential is supplied, and is formed in the wiring direction that the word lines WL1-WL6 extend. A P well voltage is for example supplied to the end of the well voltage diffusion layer K1. The width (horizontal direction along the paper surface) of the well voltage diffusion layer K1 is the same extent as the width of the region enclosed by the word lines WL1, WL3.

Plural dummy diffusion layers D1 are formed between the dummy word line DWL1 and the adjacent word line WL3, and the dummy word line DWL2 and the adjacent word line WL4. The plural dummy diffusion layers D1 are N$^+$ diffusion layers supplied at a P well voltage potential or are in a floating state.

The word line WL1 is also the respective gate electrodes for the transistors Tr2, Tr4, and Tr6. The word line WL2 is in the same way, the respective gate electrodes for the transistors Tr1, Tr8, Tr3, Tr10, Tr5, and Tr12. The word line WL3 is also the respective gate electrodes for the transistors Tr7, Tr9, and Tr11. The word line WL4 is also the respective gate electrodes for the transistors Tr14, Tr16, and Tr18. The word line WL5 is also the respective gate electrodes for the transistors Tr13, Tr20, Tr15, Tr22, Tr17, and Tr24. The word line WL6 is also the respective gate electrodes for the transistors Tr19, Tr21, and Tr23.

Though not shown in the drawing, the bit line BL1 is coupled to one of either the respective drain or source (N$^+$ diffusion layer; also called bit line side diffusion layer) for transistors Tr1, Tr7, Tr13, and Tr19. The bit line BL2 is coupled to one of either the respective drain or source of the transistors Tr2, Tr8, Tr14, and Tr20. The bit line BL3 is coupled to one of either the respective drain or source of the Tr3, Tr9, Tr15, and Tr21. The bit line BL4 is coupled to one of either the respective drain or source of the transistors Tr4, Tr10, Tr16, and Tr22. The bit line BL5 is coupled to one of either the respective drain or source of the transistors Tr5, Tr11, Tr17, Tr23. The bit line BL6 is coupled to one of either the respective drain or source of the transistors Tr6, Tr12, Tr18, and Tr24. In the example in FIG. 1, the bit line side diffusion layer for the respective transistors Tr1-Tr24 is equivalent to the black dot locations.

Though not shown in the drawing, one electrode (lower electrode) of the respective capacitors C1-C24 is coupled to the other of the respective drain or source (N$^+$ diffusion layer; also called node diffusion layer) of the transistors Tr1-Tr24. The other electrode of the respective capacitors C1-C24 is for example utilized by the common cell plate electrode Cp. This cell plate electrode Cp is formed so as to cover the transistors Tr1-Tr24. In the example in FIG. 1, the node diffusion layer for each of the respective transistors Tr1-Tr24 is equivalent to the white dot locations.

Figure 2:
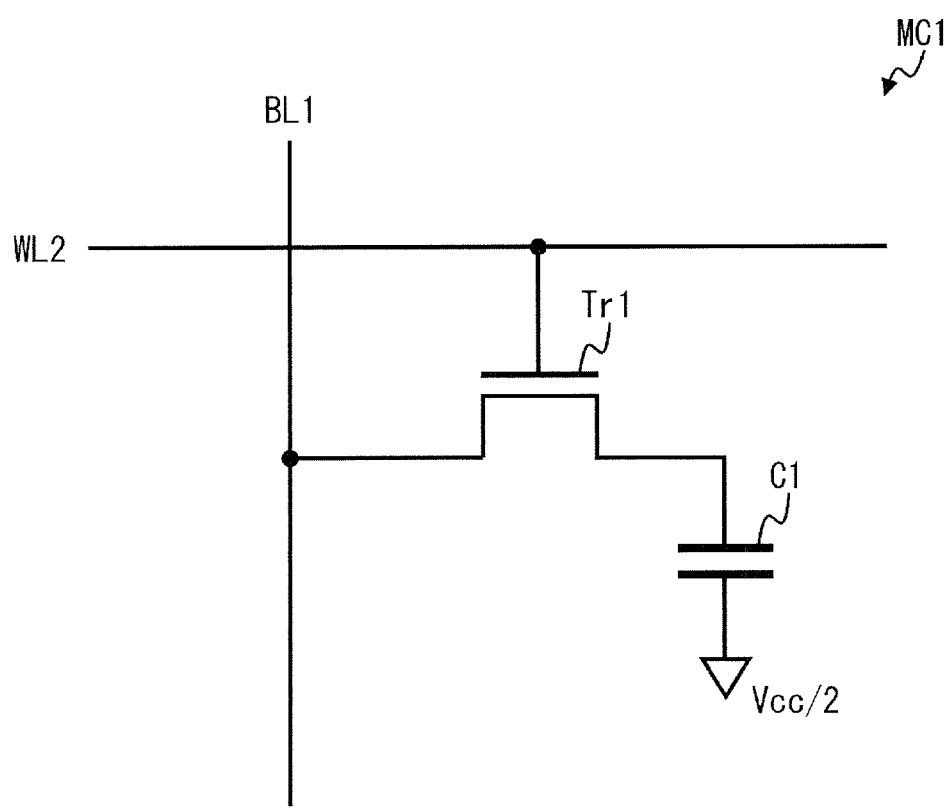
FIG. 2 is circuit drawing showing the structure of the memory cell.

FIG. 2 is circuit drawing showing an example of the structure of the memory cell MC1. The other memory cells MC2-MC24 have the same structure as the memory cell MC1 so their description is omitted. The memory cell MC1 shown in FIG. 2 is comprised of a transistor Tr1 and a capacitor C1. In the transistor Tr1, one drain or source (bit line side diffusion layer) is coupled to bit line BL1, the other drain or source (node diffusion layer) is coupled to one of the capacitor C1 electrodes, and the gate is coupled to the word line WL2. Also, approximately half of the power supply voltage Vcc is for example supplied to the other electrode (namely the cell plate electrode Cp) of the capacitor C1 as the cell plate voltage Vcp.

When for example reading out data stored in the memory cell MC1, the voltage potential of word line WL2 is set to the H level (power supply Vcc level). The transistor Tr1 is in this way turns on so that the data stored in the capacitor C1 is conveyed to the bit line BL1. The amplifier circuit installed in a subsequent (latter) stage next outputs the read-out data according to the voltage potential on the bit line BL1. On the other hand, when writing data into the memory cell MC1, the voltage potential of bit line BL1 is charged to the voltage potential according to the write data and the voltage potential of word line WL2 set to the H level. The transistor Tr1 is in this way turned on, and the data is written into the capacitor C1 from the bit line BL1.

Figure 3:
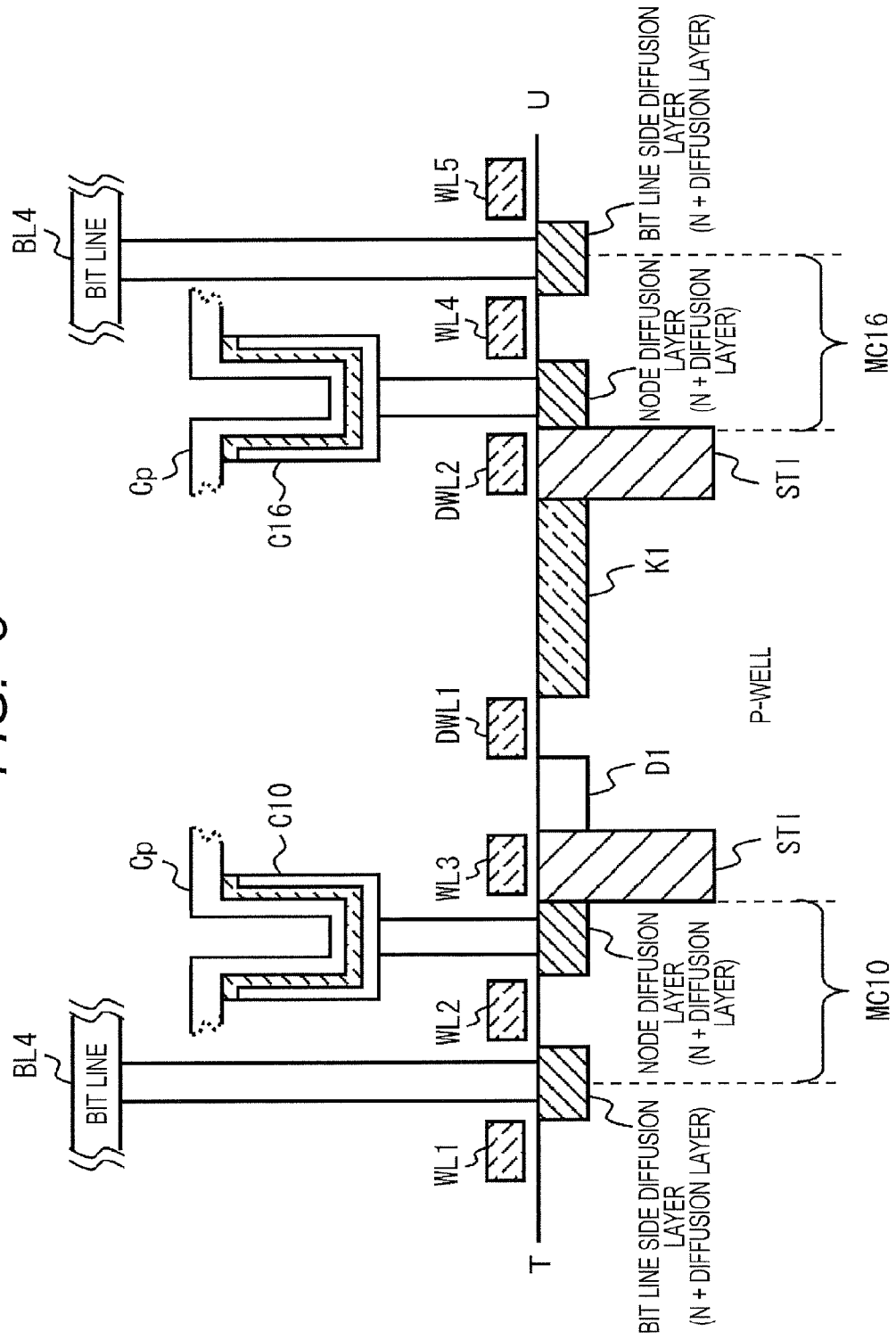
FIG. 3 is a cross sectional view showing an example of the structure of the DRAM device of the first embodiment.

FIG. 3 is a cross sectional view taken along the line T-U in FIG. 1. In the memory cell MC16 as shown in FIG. 3, two N$^+$ diffusion layers (node diffusion layer and bit line side diffusion layer) are formed over the P well. A gate insulation film (not shown in drawing) and a gate electrode are formed in sequence over the P well surface between the two N$^+$ diffusion layers. This gate electrode is a section of the word line WL4. The bit line BL4 is coupled by way of the contact plug to the bit line side diffusion layer. One electrode of the capacitor C16 (lower electrode) on the other hand, coupled by way of the contact plug to the node diffusion layer. A common cell plate electrode Cp is formed as the other electrode of the capacitors C1-C24. A cylinder type capacitor structure is employed in the example in FIG. 3.

In the memory cell MC10, two N$^+$ diffusion layers are formed over the P well the same as for the memory cell MC16. A gate insulation film (not shown in drawing) and a gate electrode are formed in sequence over the P well surface between the two N$^+$ diffusion layers. This gate electrode is one section of the word line WL2. The bit line BL4 is coupled by way of the contact plug to the bit line side diffusion layer. One electrode (lower electrode) of the capacitor C10 on the other hand, is coupled by way of a contact plug to the node diffusion layer.

Also, a dummy diffusion layer D1 serving as the N$^+$ diffusion layer, and a well voltage diffusion layer K1 serving as the P+ diffusion layer are formed over the P well, between the memory cells MC10 and MC16. The word line WL3 also serving even as a gate electrode for another row of memory cells (for example memory cell MC7) is wired over the P well surface between the dummy diffusion layer D1, and the node diffusion layer on the memory cell MC10 side. The dummy word line DWL1 is wired over the P well surface between the dummy diffusion layer D1 and the well voltage diffusion layer k1. The dummy word line DWL2 is wired over the P well surface between the well voltage diffusion layer K1 and the node diffusion layer on the memory cell M16 side.

Figure 4:
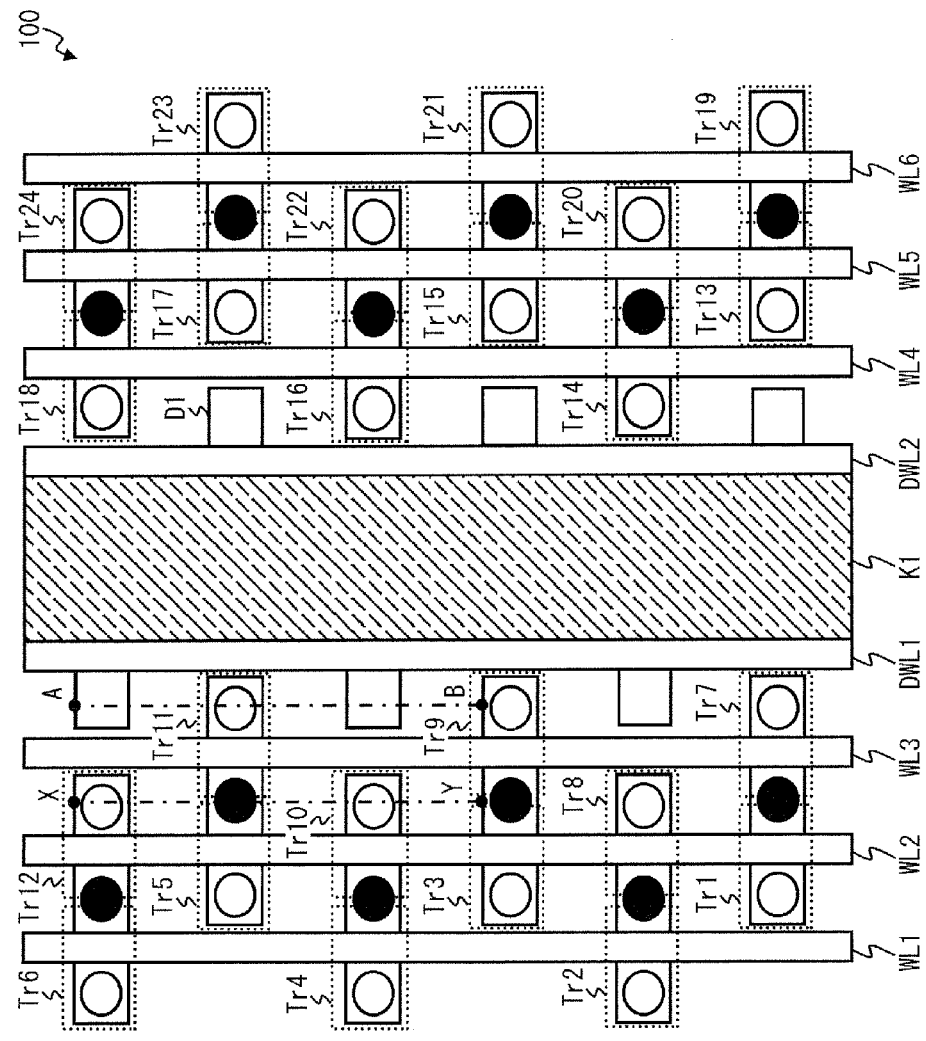
FIG. 4 is a drawing showing an example of the structure of the DRAM device of the first embodiment.
Figure 5A:
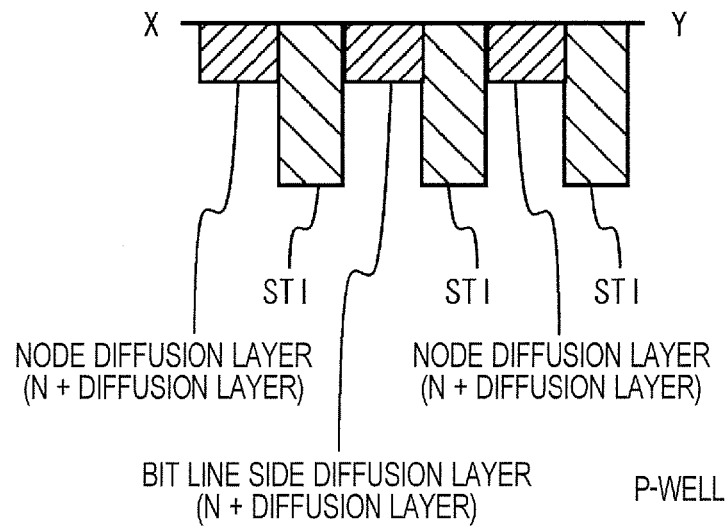
FIG. 5A is a cross sectional view showing an example of the structure of the DRAM device of the first embodiment.
Figure 5B:
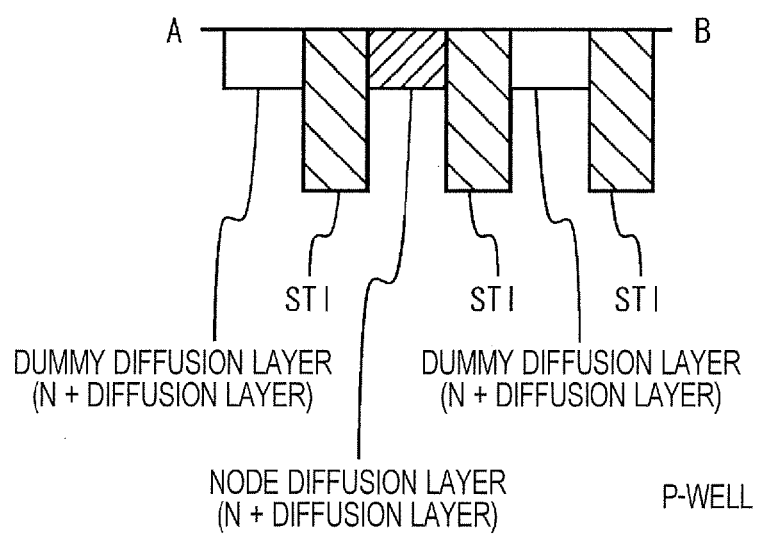
FIG. 5B is a cross sectional view showing an example of the structure of the DRAM device of the first embodiment.

Next, FIG. 5A and FIG. 5B are cross sectional views taken respectively along line X-Y and along line A-B on the DRAM device 100 shown in FIG. 4. The capacitors and bit lines, and word lines over the chip surface are respectively omitted from FIG. 5A and FIG. 5B.

The cross sectional view along line X-Y shown in FIG. 5A shows the cross section of the chip region between two word lines. Besides the plural $N^+$ diffusion layers formed at equidistant intervals over the P well surface, this cross sectional view shows STI (Shallow Trench Isolations) formed between these $N^+$ diffusion layers. The plural $N^+$ diffusion layers in the different columns are in this way electrically isolated.

The cross sectional view along the lines A-B shown in FIG. 5B shows the cross section of the chip region between the word line and the dummy word line. In this cross section, besides alternately forming the dummy diffusion layers and the $N^+$ diffusion layers at equidistant intervals over the P well, STI are also formed between these layers. The dummy diffusion layers and the $N^+$ diffusion layers in different columns are in this way electrically isolated.

The DRAM device 100 according to the present embodiment in this way includes a well voltage diffusion layer K1 for a $P^+$ diffusion layer supplied with a P well voltage potential, and formed to extend in the direction the word line wiring extends. The DRAM device 100 of the present embodiment can in this way lower the P well resistance value so that soft errors can be prevented by suppressing operation of parasitic bipolar elements. Compared to the case where there is no well voltage diffusion layer K1, the DRAM device 100 according to the present embodiment has a slightly larger surface area equivalent to two cells in the bit line direction.

Unlike the DRAM device 600 shown in FIG. 15, the well voltage diffusion layer in the DRAM device 100 of the present embodiment is not partitioned into plural word lines. The power supply for generating the P well voltage potential therefore need only be coupled by way of the power supply wiring to at least only one spot to the well voltage diffusion layer K1 and for that reason the design is simple. The power supply for generating the P well voltage potential for example is coupled to the end of the well voltage diffusion layer K1 by way of the power supply wiring. The power supply for outputting the P well voltage potential may of course be coupled to plural optional points on the well voltage diffusion layer K1. Utilizing plural couplings in this way makes maintaining a fixed voltage potential across the entire region of the well voltage diffusion layer K1 easy. Moreover, silicide treatment the surface of the well voltage diffusion layer K1 can lower the resistance value of the P well even further.

Further, unlike the DRAM device 600 shown in FIG. 15, in the DRAM device 100 of the present embodiment, the well voltage diffusion layer is formed over a wide range without being partitioned by plural word lines. The DRAM device 100 of the present embodiment in this way effectively lowers the resistance value of the P well to efficiently prevent soft errors.

The DRAM device 100 of the present embodiment also differs from the DRAM device 600 shown in FIG. 15 in that the word lines do not pass through over the $N^+$ diffusion layers and $P^+$ diffusion layers so leakage current is prevented from occurring.

The dummy word lines DWL1, DWL2 need not always be formed. However, forming the dummy word lines DWL1, DWL2 prevents displacements and so on from P type impurities contaminating the $N^+$ diffusion layer region, when forming a well voltage diffusion layer K1 by injecting (doping) P type impurities into the P well (self-aligned doping). Supplying a P well voltage to the dummy word lines DWL1, DWL2 prevents the forming of a surface inversion layer and so can prevent the $N^+$ diffusion layer from generating a leakage current.

The dummy diffusion layer D1 need not always be formed. In that case, the dummy diffusion layer D1 is replaced by the STI. However, forming the dummy diffusion layer D1 prevents a drop in the processing accuracy of the $N^+$ diffusion layer (especially the $N^+$ diffusion layer adjacent to the dummy diffusion line D1) by maintaining a specific pattern for forming the $N^+$ diffusion layer.

Moreover, the width of the well voltage diffusion layer K1 is not limited to the case in FIG. 1. If the chip size is sufficient then the width of the well voltage diffusion layer K1 may be enlarged even further. However in this case also, the plural word lines WL1-WL6 and the dummy word lines DWL1, DWL2 are preferably wired at equidistant intervals with the exception of the space between the dummy word lines DWL1 and DWL2.

A dummy memory cell may also be formed adjacent to the well voltage diffusion layer K1 in order to further improve the processing accuracy of the $N^+$ diffusion layer. The dummy memory cell may for example be formed in one or two sections along the bit line.

Second Embodiment

Figure 6:
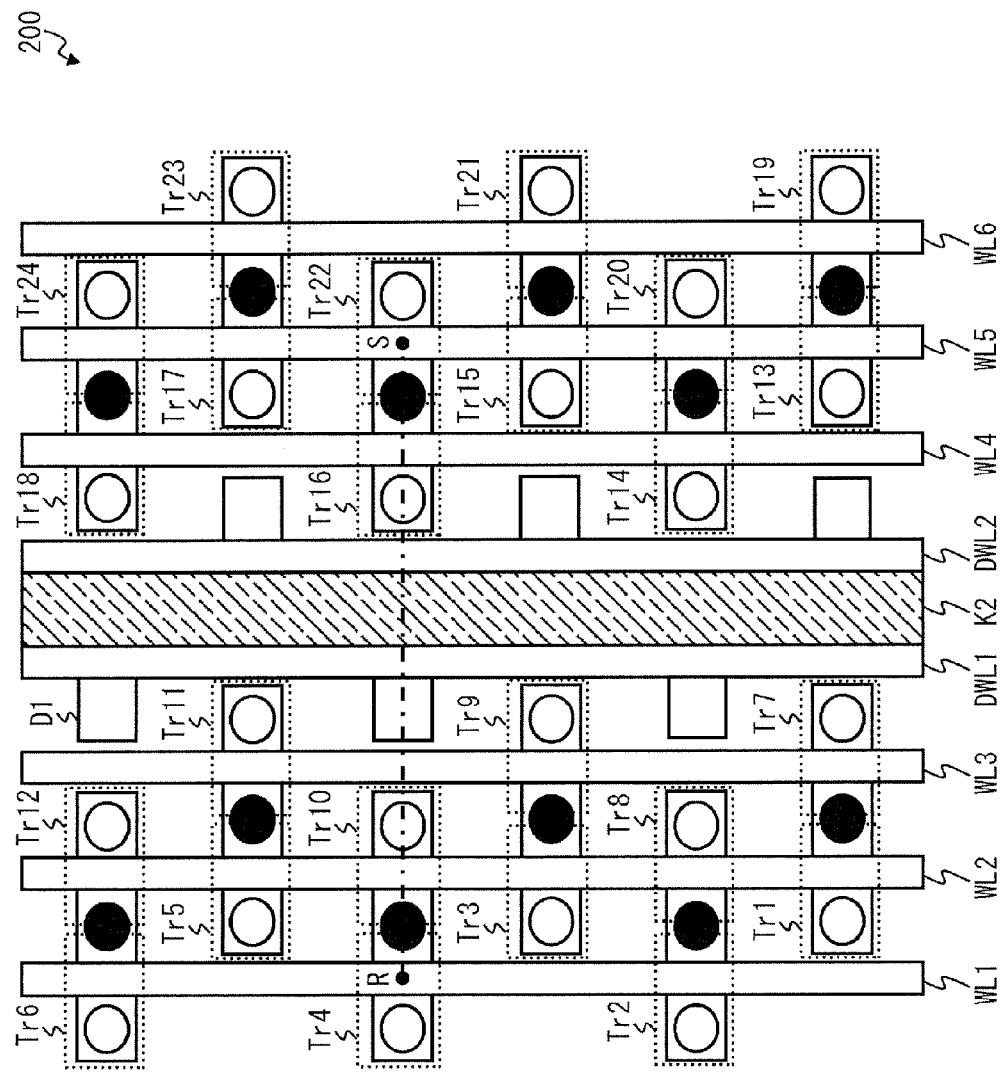
FIG. 6 is a drawing showing an example of the structure of the DRAM device of the second embodiment.

FIG. 6 is a drawing showing an example of the structure of the DRAM device 200 of the second embodiment. Unlike the DRAM device 100 shown in FIG. 1, in the DRAM device 200 shown in FIG. 6, the word lines WL1-WL6 and the dummy word lines DWL1, DWL2 are wired at equidistant intervals. Along with this, the width of the well voltage diffusion layer K2 (corresponding to the well voltage diffusion layer K1) is the same extent as the other $N^+$ diffusion layers (node diffusion layer and bit line side diffusion layer). The other structural elements and operation of the DRAM device 200 are the same as the DRAM device 100 so the same reference numerals are assigned to each element and their description is omitted.

Figure 7:
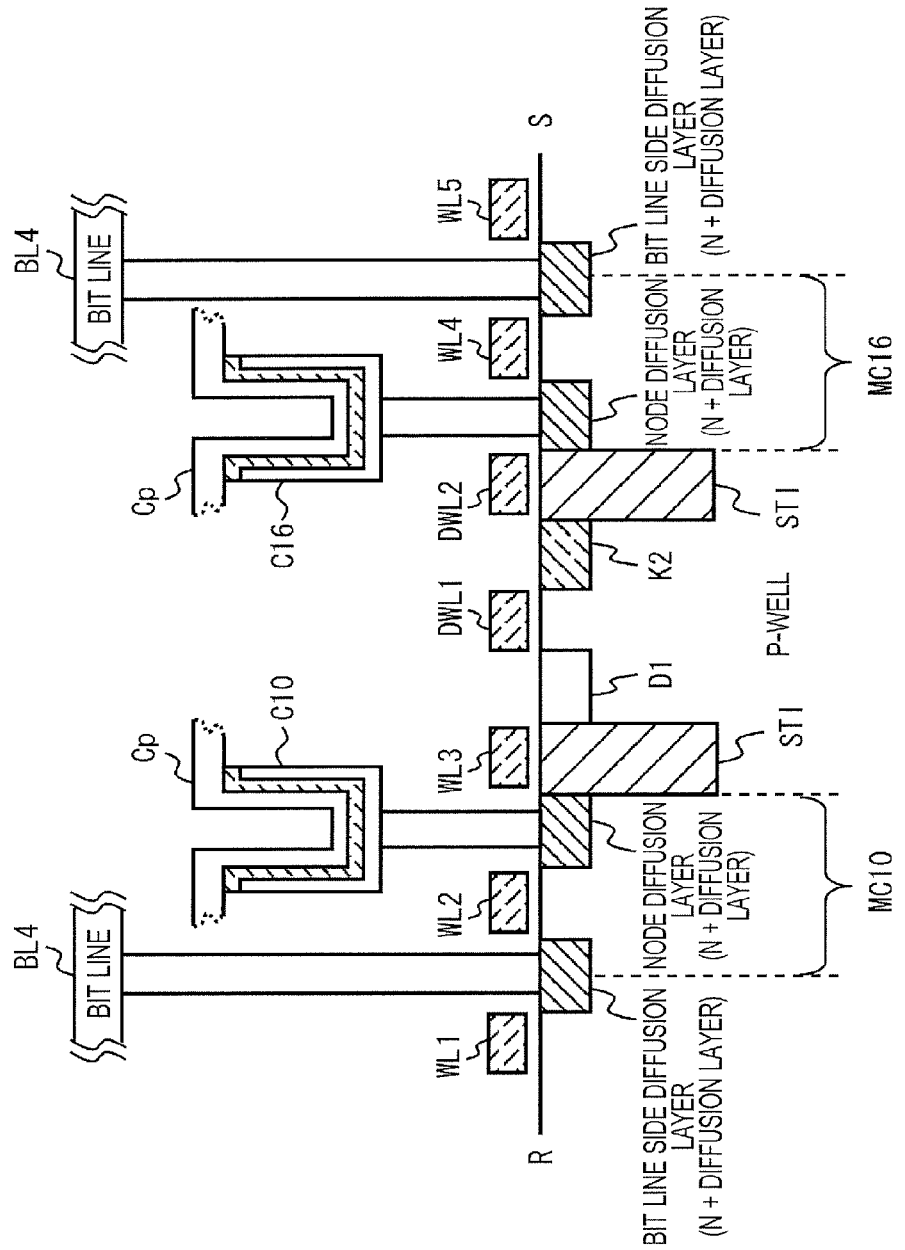
FIG. 7 is a cross sectional view showing an example of the structure of the DRAM device of the second embodiment.

FIG. 7 is a cross sectional view taken along the lines R-S in FIG. 6. As clearly shown in FIG. 7, the well voltage diffusion layer K2 width is the same extent as the other $N^+$ diffusion layers.

In the DRAM device 200 of the present embodiment, the plural word lines WL1-WL6 and the dummy word lines DWL1, DWL2 are in this way wired at equidistant intervals. Restated in other words, the word lines are wired at a specified pitch. The well voltage diffusion layer K2 for accomplishing this wiring specified pitch requires no special process and can be implemented by the usual word line wiring. However, the DRAM device 100 shown in FIG. 1 has the advantage that the resistance value of the P well is lowered even further so that the well voltage diffusion layer can be formed to a wider range. In all other respects, the DRAM device 200 of the present embodiment renders the same effects as the DRAM device 100 of the first embodiment.

Compared to the case where there is no well voltage diffusion layer K2, the DRAM device 200 according to the present embodiment has a slightly larger surface area equivalent to 1.5 cells in the bit line direction.

Third Embodiment

Figure 8:
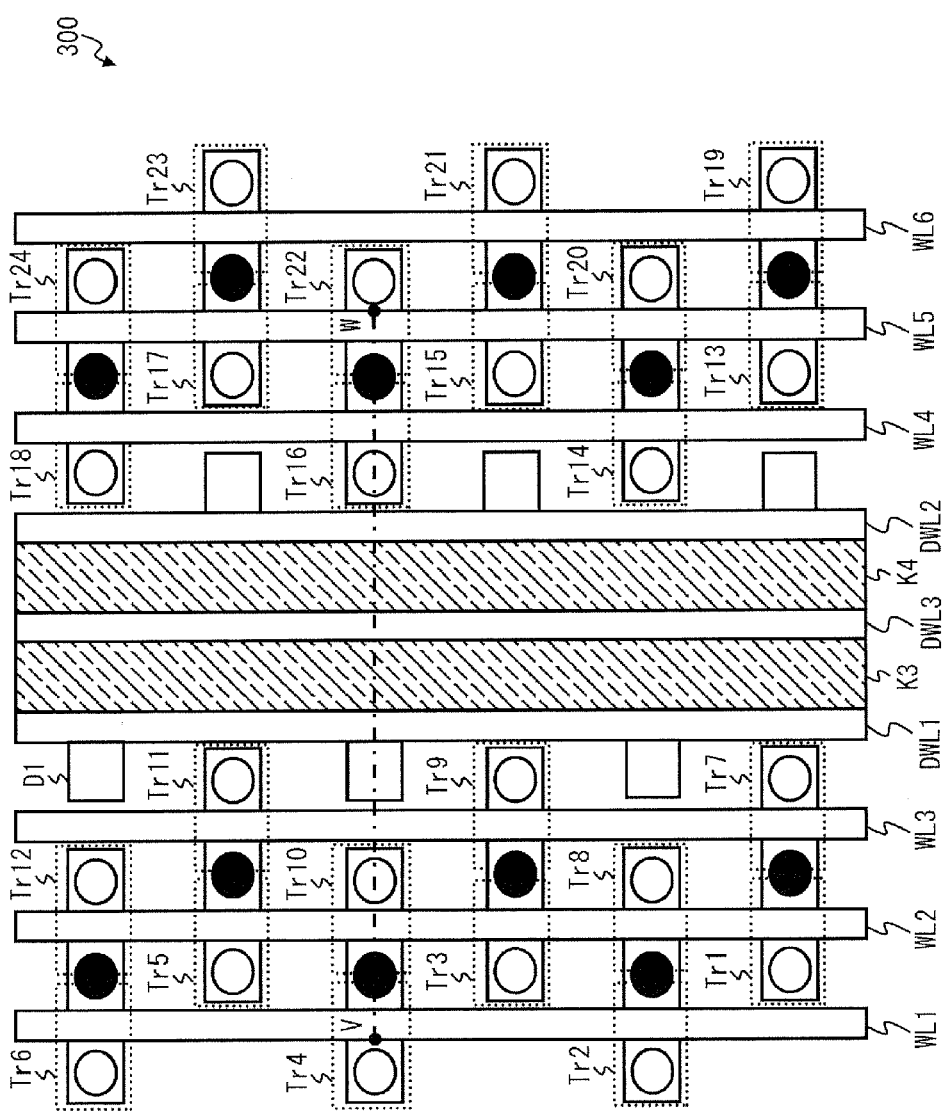
FIG. 8 is a drawing showing an example of the structure of the DRAM device of third embodiment.

FIG. 8 is a drawing showing an example of the structure of the DRAM device 300 of third embodiment. Unlike the DRAM device 100 shown in FIG. 1, plural well voltage diffusion layers K3, K4 are formed in the DRAM device 300 shown in FIG. 8.

More specifically, the dummy word lines DWL1-DWL3 are wired between the adjacent word lines WL3, WL4 among the plurality of word lines WL1-WL6. In the example in FIG.

8, the plural word lines WL1-WL6 and the dummy word lines DWL1-DWL3 are formed at equidistant intervals. A P well voltage potential (voltage potential at ground voltage GND level) is supplied to the dummy word lines DWL1-DWL3.

The well voltage diffusion layers K3 is next formed between the dummy word lines DWL1, DWL3. The well voltage diffusion layers K4 is next formed between the dummy word lines DWL3, DWL2. The well voltage diffusion layers K3, K4 are P+ diffusion layers supplied with a P well voltage potential, and formed to extend in the direction that the word lines WL1-WL6 wiring extends. The P well voltage potential for example is supplied to the respective ends of the well voltage diffusion layers K3, K4. The width of the well voltage diffusion layers K3, K4 (horizontal direction along the paper surface) is the same extent as the width of the other N+ diffusion layers.

The well voltage diffusion layers K3, K4 are also respectively called the first and second well voltage diffusion layers. The dummy word lines DWL1, DWL3 enclosing the first well voltage diffusion layer (K3) are respectively named the first the second dummy word line. The dummy word lines DWL3, DWL2 enclosing the second well voltage diffusion layer (K4) are respectively named the third and fourth dummy word lines. The word lines WL3, WL4 enclosing the first and the second dummy word lines (DWL1, DWL3) are respectively called the first and second word lines. The word lines WL3, WL4 enclosing the third and the fourth dummy word lines (DWL3, DWL2) are respectively called the third and the fourth word lines.

The other structural elements and operation of the DRAM device 300 are the same as the DRAM device 100 so the same reference numerals are assigned to each element and their description is omitted.

Figure 9:
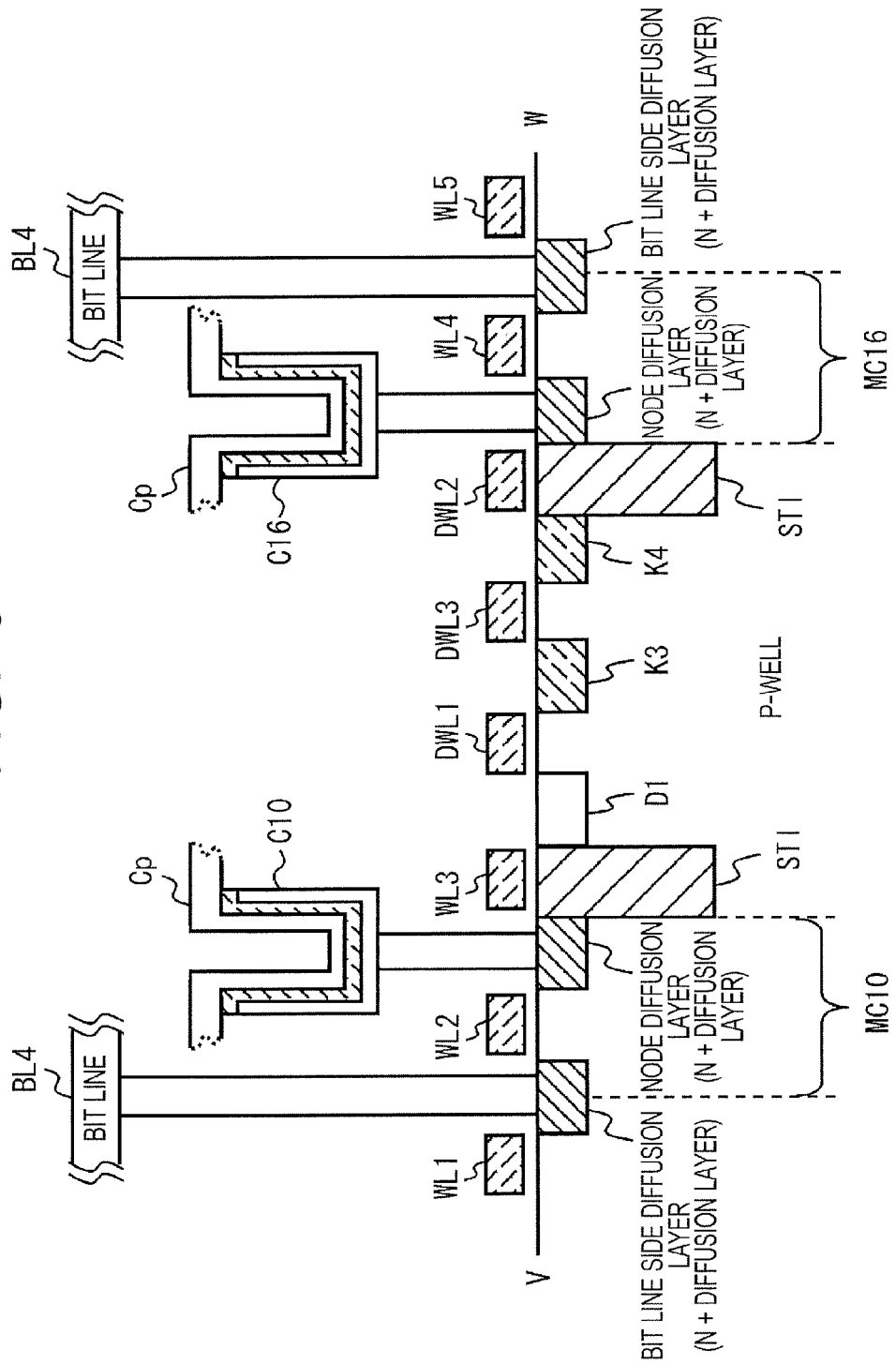
FIG. 9 is a cross sectional view showing an example of the structure of the DRAM device of the third embodiment.

FIG. 9 is a cross sectional view taken along the lines V-W in FIG. 8. As clearly shown in FIG. 9, the width of the well voltage diffusion layers K3, K4 is the same extent as in the other N+ diffusion layers.

In the DRAM device 300 of the present embodiment, the word lines WL1-WL6 and the dummy word lines DWL1-DWL3 are in this way wired at equidistant intervals so that the usual word line wiring can be implemented without requiring any special processes. In all other respects, the DRAM device 300 of the present embodiment renders the same effects as the DRAM device 100 of the first embodiment.

Compared to the case where there are no well voltage diffusion layers K3, K4, the DRAM device 300 of the present embodiment has a slightly larger surface area equivalent to two cells in the bit line direction.

In the example in the present embodiment, the case where forming adjacently two well voltage potential layers K3, K4 enclosing the dummy word lines DWL3 was described. However the present invention is not limited to this case and an optional number of two or more well voltage diffusion layers may be formed.

The DRAM devices of the first through the third embodiments as described above includes well voltage diffusion layers for P+ diffusion layers supplied with a P well voltage potential, and extending in the word line wiring direction (direction that the word lines extend). The DRAM device according to the first through the third embodiments can in this way lower the resistance value of the P well. Consequently, the DRAM device according to the first through the third embodiments is capable of suppressing operation of the parasitic bipolar element and effectively preventing soft errors.

The examples in the first through the third embodiments described the case where the transistors comprising a portion of the memory cell were N-channel MIS transistors. However the present invention is not limited to this description and may employ P-channel MIS transistors. In that case, the P-channel MIS transistors are P+ diffusion layers (node diffusion layer and bit line side diffusion layer) formed over an N well.

The example in the above first through the third embodiments also described the case where the capacitor forming a portion of the memory cell was a cylinder (stack) type. However the present invention is not limited to this description and the capacitor may employ a trench type.

The example in the above first through the third embodiments also described the case where the 24 memory cells were arranged in a matrix. However the present invention is not limited to this quantity and an optional number of memory cells may be utilized. In the above first through the third embodiments, forming the structure of well voltage diffusion layers and dummy word line shown at fixed intervals in a plurality of locations within one cell array allowed lowering the resistance value through the entire P well. Restated simply in other words, the resistance value of the P well as seen from a MIS transistor is lowered to approximately $1/(N+1)$ when N (N is a natural number) number of well voltage diffusion layers are formed at fixed intervals.

The example in the above first through the third embodiments also described the case where the diffusion layer of the transistor comprising a portion of the memory cell was placed in a direction perpendicular to the direction of the word line wiring (direction the word lines extend) however the present invention is not limited to this direction and the diffusion layer may be placed diagonally.

In the example in the above first through the third embodiments, the voltage potential of the P well may be the ground voltage GND level or even a negative voltage potential that is lower than the ground voltage GND level. In this case, an applicable negative voltage potential is supplied to the well voltage diffusion layer or dummy word line. A negative voltage generator circuit is installed when the P well voltage potential is a negative voltage potential lower than the ground voltage GND level.

The surface of the well voltage diffusion layer may be subjected to silicide treatment as described above. The resistance value of the P well can in this way be lowered even further.

The example in the above first through the third embodiments also described the case where using a CUB (Capacitor Under Bit line) structure where the bit lines in a section above the capacitor, however the present invention is not limited to this structure and may utilize a COB (Capacitor Over Bit line) structure where the bit lines are in a section below the capacitor. In any of the structures, the cell plate electrode (electrode above the capacitor) is mounted so as to cover the transistors comprising a portion of the memory cells. For that reason, supplying a P well voltage potential to an optional location on the well voltage dispersion layer is comparatively difficult. However, in the above first through the third embodiments, the well voltage diffusion layer is formed extending along the direction of the word lines (extension direction) without being partitioned so that supplying a P well voltage potential to at least the end of the well voltage diffusion layer will prove sufficient. If the forming range (surface area) for the well voltage diffusion layer is large such as shown in FIG. 1, then the P well voltage potential can be supplied to an optional location on the well voltage diffusion layer without employing a cell plate electrode.

The above first through the third embodiments are mainly more effective in DRAM devices than in memories such as FLASH and MRAM.

Difference Versus the Related Art

The memory device as disclosed in Japanese Unexamined Patent Application Publication No. Hei6(1994)-20469 temporarily applied a specified bias voltage to the array well in order to decrease the well noise and basically is not intended to prevent the operation of the parasitic bipolar element. Moreover, Japanese Unexamined Patent Application Publication No. Hei6(1994)-20469 contains no specific description of how to place the contacts over the array well supplied with the specified voltage. In other words, Japanese Unexamined Patent Application Publication No. Hei6(1994)-20469 does not disclose how to form the well voltage diffusion layer to effectively prevent the operation of the parasitic bipolar element. The DRAM devices according first through the third embodiments however include a well voltage diffusion layer for the P$^+$ diffusion layer supplied with a P well voltage potential, and formed to extend in the direction the word line wiring extends. The DRAM device according to the first through the third embodiments is in this way capable of suppressing operation of the parasitic bipolar element and effectively preventing soft errors.

In the SRAM according to Japanese Unexamined Patent Application Publication No. 2003-100904, etc., the P well and the N well are positioned alternately so that forming a well voltage dispersion layer in the direction that the word lines wiring extends is difficult. Accordingly, the above first through the third embodiments cannot easily be conceived or rendered from the SRAM according to Japanese Unexamined Patent Application Publication No. 2003-100904, etc.

The present invention was described in detail based on the embodiments of the invention rendered by the present inventors. However, the present invention is not limited to the above described embodiments and all manner of variations and adaptations not departing from the spirit and scope of the present invention are permissible.

What is claimed is:

1. A DRAM device comprising:
   a plurality of second conduction type MIS transistors arranged in a matrix shape over a first conduction type well;
   a plurality of capacitors formed corresponding to each of the plurality of second conduction type MIS transistors;
   a plurality of word lines formed corresponding to each row of the plurality of second conduction type MIS transistors;
   a plurality of bit lines formed to correspond to each column of the plurality of second conduction type MIS transistors; and
   a first conduction type first well voltage diffusion layer supplied with a well voltage potential, and formed extending in a direction that the plurality of word lines extend.

2. The DRAM device according to claim 1,
   wherein the first well voltage diffusion layer is formed between adjacent first and second word lines among the plurality of word lines.

3. The DRAM device according to claim 1, further comprising:
   a first and a second dummy word line supplied with the well voltage potential and formed between adjacent first and second word lines among the plurality of word lines, wherein the first conduction type first well voltage diffusion layer is formed between the first and the second dummy word lines.

4. The DRAM device according to claim 3,
   wherein the first and the second dummy word lines and the plurality of word lines are each formed at equidistant intervals.

5. The DRAM device according to claim 3, further comprising:
   dummy diffusion layers between a first word line of the plurality of word lines and the first dummy word line, and between a second word line of the plurality of word lines and the second dummy word line.

6. The DRAM device according to claim 1,
   wherein the well voltage potential is supplied to the ends on the first conduction type first well voltage diffusion layer.

7. The DRAM device according to claim 1,
   wherein the first conduction type first well voltage diffusion layer is subjected to silicide treatment.

8. The DRAM device according to claim 1, further comprising:
   a first conduction type second well voltage diffusion layer supplied with the well voltage potential, and formed extending in the direction that the plurality of word lines extend.

9. The DRAM device according to claim 8, wherein the first conduction type first well voltage diffusion layer is formed between the adjacent first and second word lines among the plurality of word lines, and
   the first conduction type second well voltage diffusion layer is formed between adjacent third and fourth word lines among the word lines.

10. The DRAM device according to claim 8, further comprising:
    a first and second dummy word lines supplied with the well voltage potential and formed between the adjacent first and second word lines among the plurality of word lines; and
    a third and fourth dummy word lines supplied with the well voltage potential and formed between the adjacent third and fourth word lines among the plurality of word lines,
    wherein the first conduction type first well voltage diffusion layer is formed between the first and the second dummy word lines, and
    wherein the first conduction type second well voltage diffusion layer is formed between the third and the fourth dummy word lines.

11. The DRAM device according to claim 10,
    wherein the first through the fourth dummy word lines and the plurality of word lines are each formed at equidistant intervals.

12. The DRAM device according to claim 10, further comprising:
    dummy diffusion layers formed respectively between the first word line and the first dummy word line; between the second word line and the second dummy word line; between the third word line and the third dummy word line; and between the fourth word line and the fourth dummy word line.

13. The DRAM device according to claim 8,
    wherein the well voltage potential is supplied to the respective ends of the first conduction type first and the second well voltage diffusion layers.

14. The DRAM device according to claim 8, wherein the first conduction type first and the second well voltage diffusion layers are subjected to suicide treatment.

* * * * *